(12) United States Patent
Nadeau-Dostie et al.

(10) Patent No.: US 6,457,161 B1
(45) Date of Patent: Sep. 24, 2002

(54) METHOD AND PROGRAM PRODUCT FOR MODELING CIRCUITS WITH LATCH BASED DESIGN

(76) Inventors: Benoit Nadeau-Dostie, 17 Croissant de la Paix, Aylmer, Quebec (CA), J9H 3X7; Fadi Maamari, 1038 Camino Ricardo, San Jose, CA (US) 95125; Dwayne Burek, 5649 Le Fevre Dr., San Jose, CA (US) 95118

( * ) Notice: Subject to any disclaimer, the term of this patent is extended or adjusted under 35 U.S.C. 154(b) by 64 days.

(21) Appl. No.: 09/817,298

(22) Filed: Mar. 27, 2001

(51) Int. Cl.⁷ .............................................. G06F 17/50
(52) U.S. Cl. ................................................ 716/6; 716/3
(58) Field of Search .............................. 716/6, 3, 5, 21

(56) References Cited

U.S. PATENT DOCUMENTS

| | | |
|---|---|---|
| 3,783,254 A | 1/1974 | Eichelberger |
| 5,619,511 A | 4/1997 | Sugisawa et al. |
| 5,742,190 A | 4/1998 | Banik et al. |
| 5,872,795 A | 2/1999 | Parvathala et al. |
| 6,247,154 B1 * | 6/2001 | Bushnell et al. ............ 714/733 |
| 6,247,165 B1 * | 6/2001 | Wohl et al. .................... 716/21 |

OTHER PUBLICATIONS

E.B. Eichelberger et al, "Logic Design Structure for LSI Testability", The Proceedings of the 14th Design Automation Conference, 1977, pp. 462–468.

* cited by examiner

Primary Examiner—Timothy P. Callahan
Assistant Examiner—Cassandra Cox
(74) Attorney, Agent, or Firm—Eugene E. Proulx

(57) ABSTRACT

A method of and computer program product for modeling a logic circuit having combinational logic and latches, in which the latches are clocked by one of a first clock phase, a second clock phase or a pulse derived from the second clock phase, a subset of latches being scannable, comprises, for each latch in the logic circuit, associating the latch with one of the first and second clock phase; and when latch is associated with the first clock phase, modeling the latch as a buffer connected between the data input and output of latch; and when the latch is associated with the second clock phase, modeling the latch as an edge-triggered flip-flop having the same data input, data output and clock input as the latch.

25 Claims, 4 Drawing Sheets

METHOD AND PROGRAM PRODUCT FOR MODELING CIRCUITS WITH LATCH BASED DESIGN

The present invention relates to a method and a computer program product for modeling a latch-based design logic circuits to enable the use of conventional circuit analysis software programs.

BACKGROUND OF THE INVENTION

Sugisawa et al U.S. Pat. No. 5,619,511 granted on Apr. 8, 1997 for "Dynamic Scan Circuit and Method of Using Same", Fetherston et al in "Testability Features of AMD-K6 Microprocessor", International Test Conference 1997, pp. 408–413, both incorporated herein by reference, and FIG. 1 herein show examples of latches that need to be modeled in order to enable several circuit analysis software programs like Automatic Test Pattern Generator (ATPG), fault simulator, testability analysis, and others to handle this type of circuit. These software programs usually assume that the memory elements used in the circuit are D-type edge-triggered flip-flops. A D-type edge-triggered flip-flop actually contains two latches connected in series. That is, a first latch captures the data input of the flip-flop, and the output of this first latch is connected to the input of the second latch. Finally, the output of the second latch also constitutes the output of the edge-triggered flip-flop. The clock of the two latches is derived from the same input clock. The input clock to the edge-triggered flip-flop is connected to the clock input of the second latch whereas the clock input of the first latch is connected to the inverse of the input clock. This way, the two latches are never transparent at the same time.

Banik et al U.S. Pat. No. 5,742,190 granted on Apr. 21, 1998 for "Method and Apparatus for Clocking Latches in a System Having Both Pulse Latches and Two-Phase Latches", incorporated herein by reference, illustrates an example of a circuit being addressed herein. The circuit has a combination of latches clocked by a first and second clock phase as well as by a pulse derived from the second clock phase. The latches which are clocked by such pulse are referred to as pulse latches. The patent describes a method of generating clock pulses from the second clock phase. A pulse latch behaves almost exactly like an edge-triggered flip-flop because the latch updates its output and captures its input around the time of the rising edge of the second clock phase. The difference is that the capture occurs on the falling edge of the pulse. The width of the pulse can be made very small so that a pulse latch can be treated like an edge-triggered flip-flop for the purpose of circuit analysis. Most software programs of the type mentioned earlier cannot handle circuitry of this type.

Parvathala et al U.S. Pat. No. 5,872,785 granted on Feb. 16, 1999 for "Method and Apparatus for Scan Testing of Multi-Phase Logic", incorporated herein by reference, describes a circuit modeling technique for latch-based circuits. However, there is a number of limitations with this technique. First, the method does not show how to model the scan cells. These cells are not readily recognizable by the software programs assuming edge-triggered flip-flops. Second, the patent does not describe how to model latches associated with the second clock phase that also use a non-scan cell which are common in high-performance circuits. Third, the patent does not describe how to model pulse generators found in circuits containing pulse latches. Fourth, the patent does not describe how to validate the underlying assumptions under which the models can be used.

In order to overcome these problems, it has been necessary to modify or model portions of a circuit description in such a manner as to allow existing software programs to operate properly. Heretofore, this has been a time consuming, manual task. It would be desirable to provide a method and program product for automating the modeling of circuits of complex latch-based designs of the type described above.

SUMMARY OF THE INVENTION

One aspect of the present invention is defined as a method of modeling a logic circuit having combinational logic and latches, in which the latches are clocked by one of a first clock phase, a second clock phase or a pulse derived from the second clock phase, a subset of the latches being scannable, comprises, for each latch in the logic circuit, associating the latch with one of the first and second clock phase; and when the latch is associated with the first clock phase, modeling the latch as a buffer connected between the data input and output of the latch; and when the latch is associated with the second clock phase, modeling the latch as an edge-triggered flip-flop having the same data input, data output and clock input as the latch.

Another aspect of the present invention relates to a computer program product for modeling a logic circuit having combinational logic and latches, in which the latches are clocked by one of a first clock phase, a second clock phase or a pulse derived from the second clock phase, a subset of the latches being scannable, the computer program product comprises, a computer readable storage medium; means recorded on the medium for, for each latch in the logic circuit, associating the latch with one of the first and second clock phase; means recorded on the medium for modeling the latch as a buffer connected between the data input and output of the latch when the latch is associated with the first clock phase, and means recorded on the medium for modeling the latch as an edge-triggered flip-flop having the same data input, data output and clock input as the latch when the latch is associated with the second clock phase.

BRIEF DESCRIPTION OF THE DRAWINGS

These and other features of the invention will become more apparent from the following description in which reference is made to the appended drawings in which.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention. Reference may be made to active or inactive signals, logical zeroes and logical ones. When a particular signal or node is a logical zero, the signal or node is referred to as being low, inactive or in a low state. When a particular signal or node is a logical one, the signal or node is referred to as being, active, high or in a high state.

Figure 1:
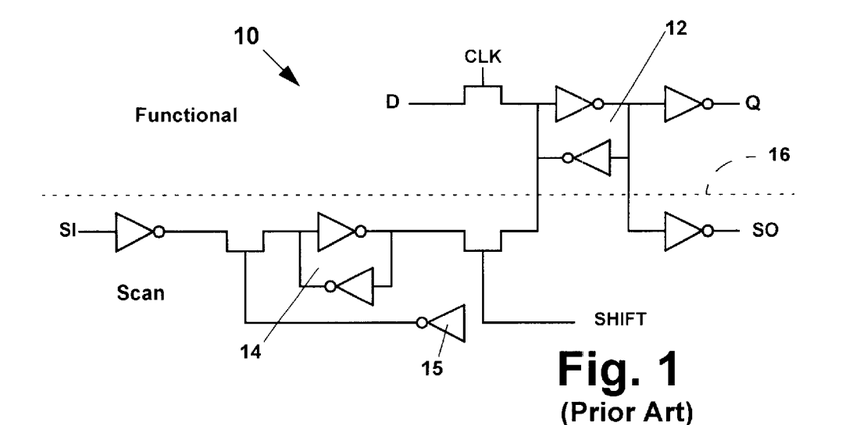
FIG. 1 illustrates an example of a typical prior art latch used in high-performance circuits.

FIG. 1 shows a basic scannable latch 10 used in high-performance circuits.

Several variations are possible as shown in the prior art discussed earlier. Latch 10 includes a functional latch portion 12 and a scannable latch portion 14. A non-scannable version of latch 10 simply consists of the circuit above the dotted line 16. During normal operation, both the scannable and non-scannable latch portions 12 and 14 behave the same way. That is, input D is connected to the output Q for as long as input clock CLK is active (high in this case). When input clock CLK becomes inactive (low in this case), the value of input D at that time is stored in latch 12 and this value remains stable and available to the rest of the circuit via output Q until input clock CLK becomes active again.

A shift clock, SHIFT, applied to the scannable latch portion 14 must be inactive when the latch is used in functional or normal mode. Each scannable latch in a circuit contains the test-dedicated latch 14, in addition to the functional latch 12, to enable the shifting of new data into and out of the functional latch for test purposes. The particular latch of FIG. 1 becomes an edge-triggered flip-flop when operated in shift mode. That is, data input at Si is captured on the rising edge of shift clock SHIFT and transferred to outputs Q and SO. The shifting operation can be implemented using a two-phase clock as is described in aforementioned U.S. Pat. No. 5,619,511 in which latch 310, the equivalent of test-dedicated latch 14, is connected to the output of latch 115, the equivalent of functional latch 12, instead of the scan input Si. This difference only causes a slight modification to the sequence of clock phases that must be applied during shift mode. In all cases, input clock CLK must be inactive when data is shifted through the latch. Several variations of these latches exist for implementing asynchronous set or reset functions. However, they can be easily derived from those illustrated herein by a person skilled in the art.

Figure 2:
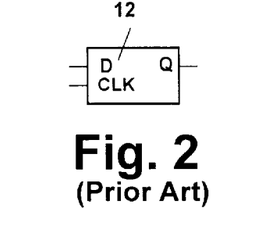
FIG. 2 illustrates a symbol used in various figures to represent a non-scannable latch.
Figure 3:
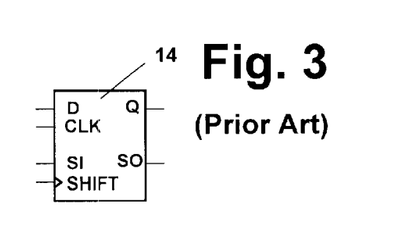
FIG. 3 illustrates a symbol used in various figures to represent a scannable latch.

FIGS. 2 and 3 are schematic representations of the non-scannable latch 12 and scannable latch 14, respectively. The small triangle adjacent the input labeled SHIFT in FIG. 3 indicates that this input is edge-sensitive. Input clock CLK is level-sensitive and is not annotated with the small triangle.

Figure 4:
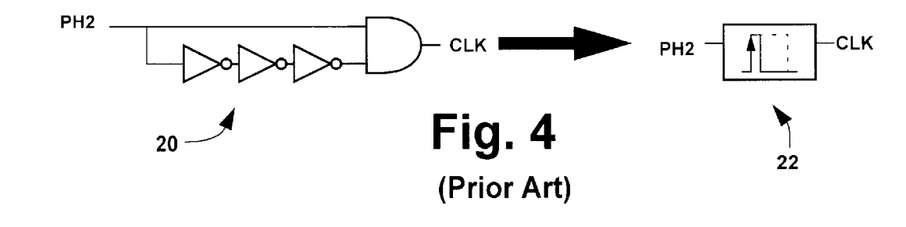
FIG. 4 is a circuit schematic of a pulse generator and illustrates a symbol used in various figures to represent a pulse generator.

FIG. 4 is a simple example of a prior art pulse generator 20, also called clock chopper, and its associated schematic representation 22. The particular pulse generator illustrated creates a pulse at its output CLK. The duration of the pulse is determined by the delay provided by serially connected inverters 24, consequent to the rising edge of an input clock PH2. Any odd number of inverters can be used. Aforementioned U.S. Pat. No. 5,742,190 provides a feedback mechanism which can be used to create the pulse. Many other implementations can be found in the literature but they are all equivalent for the purpose of the present invention.

Figure 7:
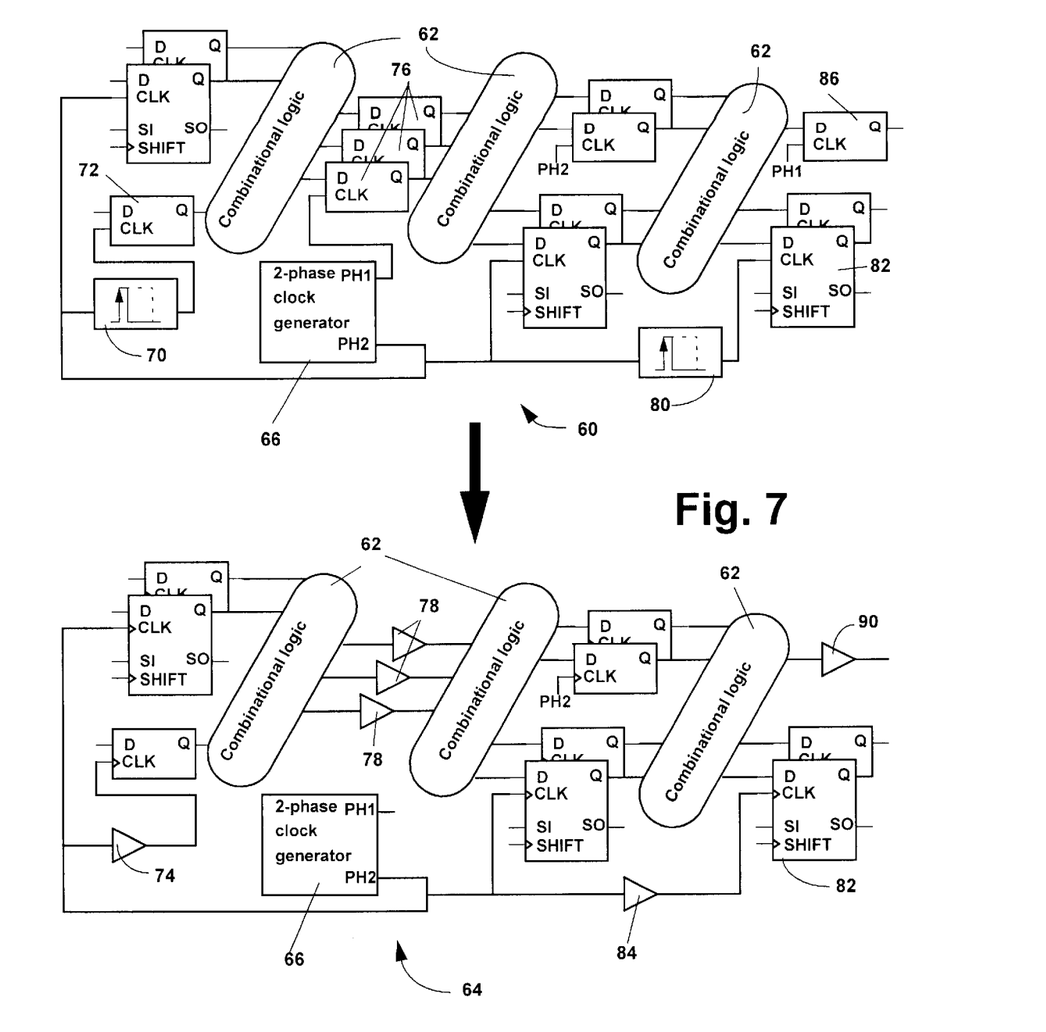
FIG. 7 illustrates a complete circuit and its equivalent model, according to an embodiment of the present invention.

In general, the present invention provides a method of and a computer program product for modeling a logic circuit having combinational logic and latches, with the latches being clocked by one of a first clock phase, a second clock phase or a pulse derived from the second clock phase. The method comprises, for each latch in the logic circuit, associating the latch with one of the first and second clock phase. When the latch is associated with the first clock phase, the latch is modeled as a buffer connected between the data input and output of said latch. When the latch is associated with the second clock phase, the latch is modeled as an edge-triggered flip-flop having the same data input, data output and clock input as the latch. These latch modeling procedures are performed only upon verifying that predetermined modeling conditions are valid or satisfied. The description will now describe specific modeling procedures and the predetermined modeling conditions according to the present invention. The overall method will then be described in more detail. In the description which follows, reference is made to clock phases PH1 and PH2. These signals are typically generated by suitable clock generator, such as two-phase clock generator 66 as shown in FIG. 7.

Figure 5:
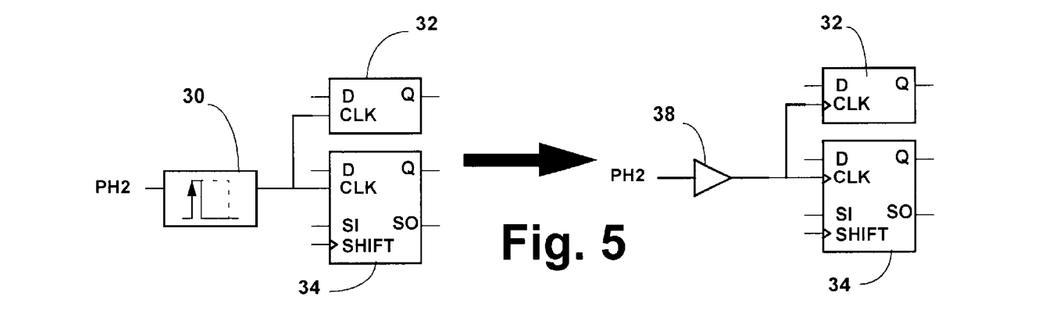
FIG. 5 illustrates a combination of a pulse generator and latches and an equivalent model according to an embodiment of the present invention.

FIG. 5 illustrates a method of modeling the combination of a pulse generator 30 and a functional latch 32 and an associated scannable latch 34, according to one embodiment of the present invention. Since latches 32 and 34 are driven by a pulse generator, they are considered to be "pulse latches". The left side of the figure shows an actual circuit using the representations of FIGS. 2–4. The right side of the figure illustrates a corresponding model 36 of the circuit for use with analysis software programs. Latches 32 and 34 are treated as edge-triggered flip-flops clocked by clock phase PH2. Pulse generator 30 is modeled as a clock buffer 38 driven by clock phase PH2. The pulse generator output is shared by both non-scannable latch 32 and scannable latch 34. It will be understood that any number of latches, scannable or non-scannable, could share the same pulse generator and that a latch generator could be part of each latch.

Figures 6, 8:
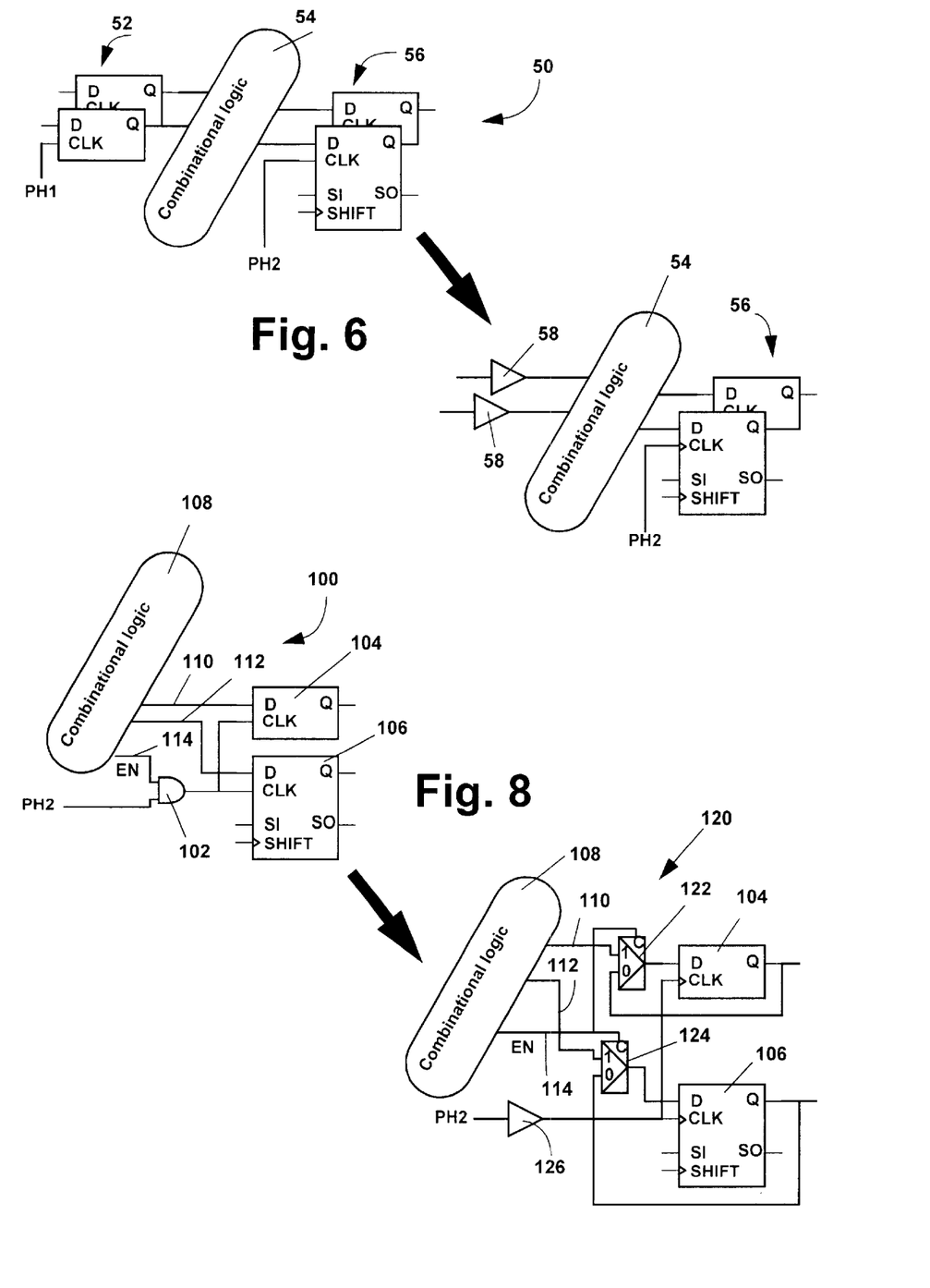
FIG. 6 illustrates a combination of latches controlled by two clock phases and its equivalent model, according to an embodiment of the present invention.
FIG. 8 illustrates a latch modeling procedure for latches having a gated clock according to an embodiment of the present invention.

FIG. 6 illustrates a circuit 50 comprised of a combination of non-pulse latches 52 and 54 and combinational logic 56. Latches 52 are clocked by a first clock phase PH1. Latches 54 are clocked by a second clock phase PH2. In accordance with the present invention, each non-pulse latch which is clocked by the first clock phase PHI is modeled as a buffer 58 connected between the data input and output of the latch and each non-pulse latch which is clocked by the second clock phase PH2 is modeled as an edge-triggered flip-flop having the same data input, data output and clock input. Latches clocked by the second clock phase PH2 are considered to be on a "cycle boundary" and determine the state of the circuit for all conventional analysis software programs. Only latches which reside on a cycle boundary need to be scannable. The specific number of scannable or non-scannable latches controlled by the second clock phase does not affect the modeling method.

The models for the pulse generators and latches shown in FIGS. 5 and 6 are valid under the following modeling conditions:

1. all scannable latches reside on a cycle boundary;
2. for each non-pulse latch, all latches in the fanin to the latch are associated with a different clock phase other than its own;

3. for each non-pulse latch associated with the first clock phase, all latches in the fanout of the latch is a non-pulse latch associated with the second clock phase;

4. for each latch associated with the second clock phase, all latches in the fanout of the latch are associated with the first clock phase or are pulse latches associated with said second clock phase; and 5. for each pulse latch, all latches in its fanin are associated with the second clock phase.

It is preferable to provide a software program product that will automatically verify these conditions and create a complete model of the circuit for the other circuit analysis software programs.

FIG. 7 illustrates a sample circuit having pulse and non-pulse latches, pulse generators, latches clocked by PH1 and PH2 and combinational logic to illustrate the manner in which a circuit is modeled according to the present invention. Referring to FIG. 7, the top half of the figure shows a portion of a circuit 60 including combinational logic 62 and latches clocked by a first clock phase PH1 or a second clock phase PH2. The bottom half of the figure illustrates a model 64 derived from the transformations described above. Clock phases, PH1 and PH2, are generated by two-phase clock generator 66. The clock phases could be provided from off-chip circuitry as well, or in any other manner well known to those skilled in the art.

The circuit includes a pulse generator 70 which receives clock phase PH2 as input and produces an output applied to the clock input of non-scannable, pulse latch 72. In model 64, pulse generator 70 is replaced by buffer 74.

Circuit 60 further includes non-scannable latches 76 clocked by first clock phase PH1. In accordance with the modeling procedure described in FIG. 6, these latches are replaced by buffers 78 in model 64.

The circuit includes a pulse generator 80 which receives PH2 as input and produces an output applied to the clock input of scannable pulse latch 82 and a non-scannable latch 84. In model 64, pulse generator 80 is replaced by buffer 85 in accordance with the modeling procedure described in FIG. 5. Finally, a non-scannable non-pulse latch 86 on the fanout of an output of combinational logic 62 is replaced by a buffer 88. In this case, the output of latch 86 fans out to latches clocked by PH2.

As will be seen, some of the latches are clocked using pulses derived from the second clock phase. A careful examination of the circuit indicates that all the conditions stated above are met and that model 64 are valid.

It is common to use clock gating techniques in high-performance and low-power circuits. FIG. 8 illustrates a method of modeling latches clocked by gated clock signals. The top half of FIG. 8 illustrates a sample circuit 100 having an AND gate 102, a non-scannable latch 104, a scannable latch 106 and combinational logic 108. AND gate 102 receives a clock phase PH2 and an enable signal EN. When inactive, signal EN prevents the latches from receiving clock phase PH2. This effectively configures the latches in a hold mode and their outputs will not change consequent to a clock pulse. When active, signal EN allows the latches to receive clock phase PH2. A first output 110 from combinational logic 108 is applied to the data input, D, of latch 104. A second output 112 from combinational logic 108 is applied to the data input, D, of latch 106. Both latches are clocked by the output of the AND gate 102. A third output 114 from combinational logic 108 is the EN signal.

The bottom half of FIG. 7 illustrates a model 120 corresponding to circuit 100 for use with circuit analysis software program products. Latches 104 and 106 are modeled as a combination of an edge-triggered flip-flop and an associated multiplexer 122 and 124, respectively, with the edge-triggered flip-flop having the same data output as the latch and having the second clock phase PH2 or pulse derived from second clock phase PH2 connected to its clock input. AND gate 102 is replaced by a buffer 126 with its output applied to the clock input of latches 104 and 106.

The multiplexers each have a first and second data inputs, an input control signal and an output. The first input (0) of multiplexer 122 is connected to the data output Q of edge-triggered flip-flop 104. The second input (1) of the multiplexer receives data from output 110 of combinational logic 108. The input control signal of both multiplexers receive is enable signal EN generated by a third output 114 of the combinational circuit 108. The output of the multiplexer is connected to the data input, D, of the edge-triggered flip-flop 104. Similarly, The first input (0) of multiplexer 124 is connected to the data output Q of edge-triggered flip-flop 106. The second input (1) of the multiplexer receives data from output 112 of combinational logic 108. The output of the multiplexer 124 is connected to the data input, D, of the edge-triggered flip-flop 106.

This model is valid as long as signal EN is stable while the input clock signal is active. If the delay through the combinational circuit is not sufficiently long to meet this condition, a pulse generator could be used to clock the latches or, another latch could be used to hold signal EN while clock phase PH2 is active. The other condition to verify is to ensure that only latches associated with the second clock phase use gated clocks.

The best mode of implementing the present invention is in a program product stored on a computer readable storage means. The program product includes means for reading a description of the logic circuit and parsing description statements to identify and latches pulse generators and tracing signal to their respective sources. Such means are known in the art and, accordingly, are not described herein. The program product will perform modeling transformations as described herein and generate an intermediate circuit description with modified statements. The intermediate circuit description can then be used with conventional software in the usual manner. It will be understood by those skilled in this art that the intermediate circuit description is not intended to replace the original circuit description; but, rather, it is intended to permit conventional software to process a description as if the conventional software had been designed to process different latch based circuit designs of the type described above.

In accordance with a specific embodiment of the method of modeling a logic circuit having combinational logic and latches, in which the latches are clocked by one of a first clock phase, a second clock phase or a pulse derived from the second clock phase, the method comprises, for each latch in the logic circuit, associating the latch with one of the first and second clock phase by tracing backward from the clock input of the latch to a clock source; and when the latch is associated with the first clock phase, modeling the latch as a buffer connected between the data input and output of the latch and when the latch is associated with the second clock phase, modeling the latch as an edge-triggered flip-flop having the same data input, data output and clock input as the latch.

Prior to performing each latch modeling step, predetermined modeling conditions are verified as valid including: when the latch is a scannable latch, verifying that the scannable latch is on a cycle boundary; when the latch is a non-pulse latch, verifying that all latches in the fanin of the latch are associated with a different clock phase than the clock phase of the latch; when the latch is a non-pulse latch associated with the first clock phase, verifying that all latches in the fanout of the latch is a non-pulse latch associated with the second clock phase; when the latch is associated with the second clock phase, verifying that all latches in the fanout of the latch are associated with the first clock phase or are pulse latches associated with the second clock phase; and when the latch is a pulse latch, verifying that all latches in the fanin of the latch are associated with the second clock phase.

The method further includes, for each pulse generator which clocks a latch and generates a pulse derived from the second clock phase, modeling the pulse generator as a buffer connected between a clock input and clock output of the pulse generator.

The method also includes, for each latch having a clock input which is gated by an enable signal generated by a first output of a combinational circuit, and receiving input data from a second output of the combinational circuit and having and a data output, when the latch is associated with the second clock phase, modeling the latch as a combination of an edge-triggered flip-flop and a multiplexer with the edge-triggered flip-flop having the same data output as the latch and having the second clock phase or the pulse derived from the second clock phase connected to its clock input, the multiplexer having a first and second data input, an input control signal and an output, the first input of the multiplexer being connected to the data output of the edge-triggered flip-flop, the second input of the multiplexer receiving data from the second output of the combinational circuit, the input control signal of the multiplexer receiving the enable signal generated by the second output of the combinational circuit, and the output of the multiplexer being connected to the data input of the edge-triggered flip-flop.

Except for the verification steps which are performed prior to a modeling operation, not all of the steps must be performed on a particular circuit description. The actual steps which are performed depends on the composition of the circuit.

Figure 9:
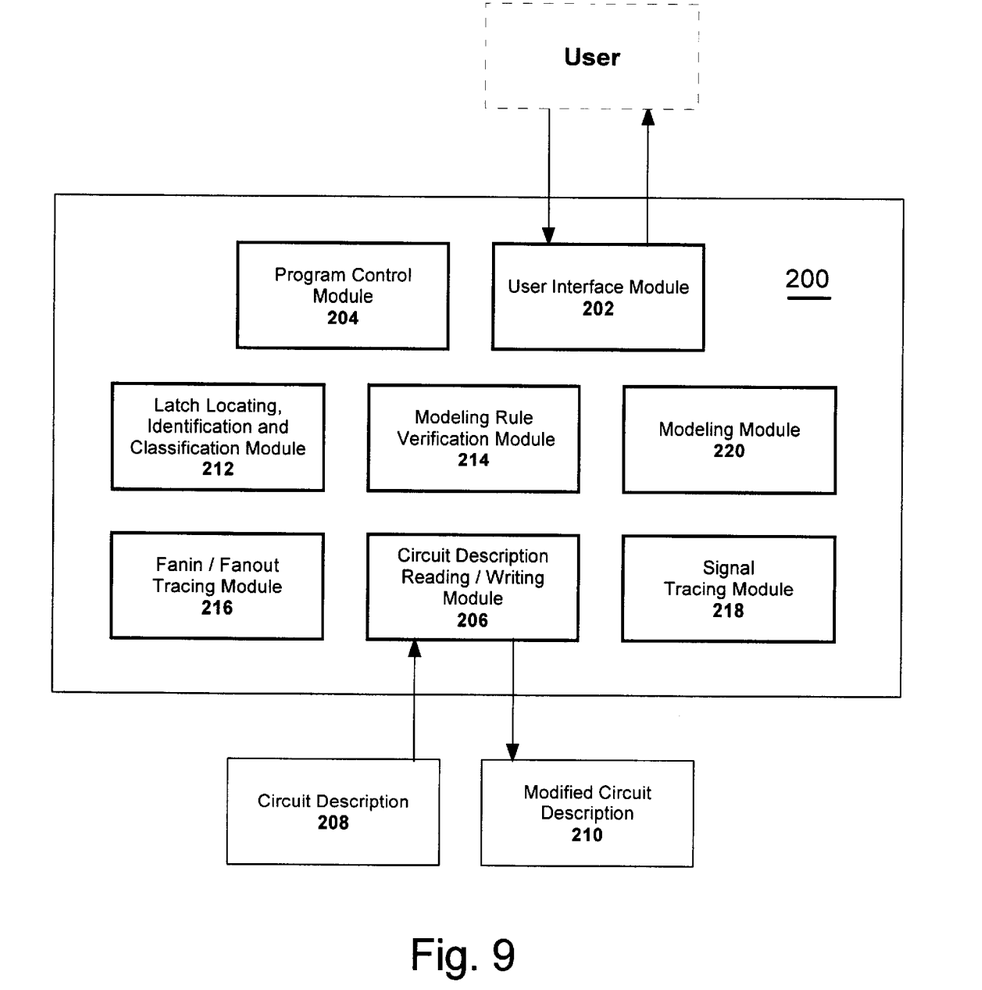
FIG. 9 is a block diagram illustration of the major components of a computer program product according to an embodiment of the present invention.

As mentioned, the present invention also provides a computer program product 200 is stored on a computer readable storage medium (not shown). FIG. 9 diagrammatically illustrates major components of the program product. The program product includes a number of modules designed to perform specific tasks in accordance with the present invention. The program product includes an appropriate User Interface module 202 to allow a user to invoke the program and specify various parameters including the name and location of a circuit description to be processed and the name and destination for a modified circuit description. A Program Control module 204 is responsive to the user interface module for implementing the above described modeling method and procedures of the present invention and for calling or invoking the various modules. A Circuit Description Reading/Writing Module 206 is operable to read a specified circuit description 208 and write out a modified circuit description 210 after modeling of latches and other components. A Latch Locating, Identification and Classification Module 212 is operable to search for and identify latches and pulse generators in the circuit description and classify the latches as pulse latches, non-pulse latches, scannable latches, and so forth, as required to implement the methods of the present invention. A Modeling Rule Verification Module 214 is operable to verify that each latch satisfies predetermined conditions or rules prior to modeling of a latch. A Fanin/Fanout Tracing Module 216 is called to interrogate latches in the fanin and fanout of latch inputs and outputs. A Signal Tracing Module 218 is called to trace signal inputs to and identify their respective sources. A Modeling Module 220 is called to perform appropriate model transformation of latches and pulse generators.

Thus, the program product 200 comprises a computer readable storage medium; a means 204 recorded on the medium for associating each latch in the logic circuit with one of the first and second clock phase including means for tracing backward from the clock input of the latch to a clock source; a means 220 recorded on the medium for modeling a latch as a buffer connected between the data input and output of the latch when the latch is associated with the first clock phase; and for modeling a latch as an edge-triggered flip-flop having the same data input, data output and clock input as the latch when the latch is associated with the second clock phase; for identifying a pulse generator for clocking a latch and generating a pulse derived from the second clock phase and modeling an identified pulse generator as a buffer connected between a clock input and clock output of the pulse generator; for identifying a latch having a clock input gated by an enable signal generated by a first output of a combinational circuit and receiving input data from a second output of the combinational circuit, and which is associated with the second clock phase, and for modeling a latch, identified by the means for identifying, as a combination of an edge-triggered flip-flop and a multiplexer, with the edge-triggered flip-flop having the same data output as the latch and having the second clock phase or the pulse derived from the second clock phase connected to its clock input, and the multiplexer having a first and second data input, an input control signal and an output, the first input of the multiplexer being connected to the data output of the edge-triggered flip-flop, the second input of the multiplexer receiving data from the second output of the combinational circuit, the input control signal of the multiplexer receiving the enable signal generated by the second output of the combinational circuit, and the output of the multiplexer being connected to the data input of the edge-triggered flip-flop; and a means 214 recorded on the medium for verifying that predetermined modeling conditions are valid or satisfied including: means for determining whether the latch is a scannable latch and, if so, verifying that the scannable latch is on a cycle boundary; means for determining whether the latch is a non-pulse latch and, if so, verifying that all latches in its fanin are associated with a different clock phase than its own; means for determining whether the latch is a non-pulse latch associated with the first clock phase and, if so, verifying that all latches in the fanout of the latch is a non-pulse latch associated with the second clock phase; means for determining whether the latch is associated with the second clock phase and, if so, verifying that all latches in the fanout of the latch are associated with the first clock phase or are pulse latches associated with the second clock phase; and means for determining whether the latch is a pulse latch and, if so, verifying that all latches in the fanin of the latch are associated with the second clock phase.

Although the present invention has been described in detail with regard to preferred embodiments and drawings of the invention, it will be apparent to those skilled in the art that various adaptions, modifications and alterations may be accomplished with departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A method of modeling a logic circuit having combinational logic and latches, said latches being clocked by one of a first clock phase, a second clock phase or a pulse derived from the second clock phase, said method comprising, for each latch in said logic circuit:
   associating said latch with one of said first and second clock phase; and
   modeling said latch as a buffer connected between the data input and output of said latch when said latch is associated with said first clock phase; or
   modeling each latch as an edge-triggered flip-flop having the same data input, data output and clock input as said latch when said latch is associated with said second clock phase.

2. A method as defined in claim 1, further including for each pulse generator clocking a latch and generating said pulse derived from the second clock phase, modeling said pulse generator as a buffer connected between a clock input and clock output of said pulse generator.

3. A method as defined in claim 1, further including, for each latch having a clock input which is gated by an enable signal generated by a first output of a combinational circuit, and receiving input data from a second output of said combinational circuit and having and a data output, when said latch is associated with said second clock phase, modeling said latch as a combination of an edge-triggered flip-flop and a multiplexer, said edge-triggered flip-flop having the same data output as said latch and having said second clock phase or said pulse derived from said second clock phase connected to its clock input, said multiplexer having a first and second data input, an input control signal and an output, said first input of said multiplexer being connected to said data output of said edge-triggered flip-flop, said second input of said multiplexer receiving data from said second output of said combinational circuit, said input control signal of said multiplexer receiving said enable signal generated by said second output of said combinational circuit, and said output of said multiplexer being connected to said data input of said edge-triggered flip-flop.

4. A method as defined in claim 1, said associating said latch with said first or second clock phase including tracing backward from the clock input of each said latch to a clock source.

5. A method as defined in claim 1, further verifying that predetermined modeling conditions are satisfied prior to each said modeling said latch.

6. A method as defined in claim 5, further including identifying scannable latches associated with the second clock phase as a cycle boundary and said verifying conditions under which a modeling method is valid including verifying that all scannable latches are on cycle boundaries.

7. A method as defined in claim 5, said verifying conditions under which a modeling method is valid including, for each non-pulse latch, verifying that all latches in the fanin of said latch are associated with a different clock phase than its own.

8. A method as defined in claim 5, said verifying conditions under which a modeling method is valid including, for each non-pulse latch associated with said first clock phase, verifying that all latches in the fanout of said non-pulse latch is a non-pulse latch associated with said second clock phase.

9. A method as defined in claim 5, said verifying conditions under which a modeling method is valid including, for each latch associated with said second clock phase, verifying that all latches in the fanout of said latch are associated with said first clock phase or are pulse latches associated with said second clock phase.

10. A method as defined in claim 5, said verifying conditions under which a modeling method is valid including, for each pulse latch, verifying that all latches in the fanin of each said pulse latch are associated with said second clock phase.

11. A method as defined in claim 1, further including, prior to each said modeling said latch, verifying that predetermined modeling conditions are valid including:
   when said latch is a scannable latch, verifying that said scannable latch is on a cycle boundary;
   when said latch is a non-pulse latch, verifying that all latches in its fanin are associated with a different clock phase than its own;
   when said latch is a non-pulse latch associated with said first clock phase, verifying that all latches in the fanout of said latch is a non-pulse latch associated with said second clock phase;
   when said latch is associated with said second clock phase, verifying that all latches in the fanout of said latch are associated with the first clock phase or are pulse latches associated with said second clock phase; and
   when said latch is a pulse latch, verifying that all latches in the fanin of said latch are associated with said second clock phase.

12. A method of modeling a logic circuit having combinational logic and latches, said latches being clocked by one of a first clock phase, a second clock phase or a pulse derived from the second clock phase, said method comprising the steps of: for each said latch in said logic circuit,
   associating said latch with one of said first and second clock phase including
     tracing backward from the clock input of said latch to a clock source; and
     modeling said latch as a buffer connected between the data input and output of said latch when said latch is associated with said first clock phase;
     modeling each latch as an edge-triggered flip-flop having the same data input, data output and clock input as said latch when said latch is associated with said second clock phase; and
further including, prior to each said modeling said latch, verifying that predetermined modeling conditions are valid including:
   determining whether said latch is a scannable latch and, if so, verifying that said latch is on a cycle boundary;
   determining whether said latch is a non-pulse latch and, if so, verifying that all latches in its fanin are associated with a different clock phase than its own;
   determining whether said latch is a non-pulse latch associated with said first clock phase and, if so, verifying that all latches in the fanout of said latch is a non-pulse latch associated with said second clock phase;
   determining whether said latch is associated with said second clock phase and, if so, verifying that all latches in the fanout of said latch are associated with the first clock phase or are pulse latches associated with said second clock phase; and
   determining whether said latch is a pulse latch and, if so, verifying that all latches in the fanin of said latch are associated with said second clock phase; and
   for each pulse generator clocking a latch and generating said pulse derived from the second clock phase, modeling said pulse generator as a buffer connected between a clock input and clock output of said pulse generator.

13. A method as defined in 12, further including, for each latch having a clock input which is gated by an enable signal generated by a first output of a combinational circuit, and receiving input data from a second output of said combinational circuit and having and a data output, when said latch is associated with said second clock phase, modeling said latch as a combination of an edge-triggered flip-flop and a multiplexer, said edge-triggered flip-flop having the same data output as said latch and having said second clock phase or said pulse derived from said second clock phase connected to its clock input, said multiplexer having a first and second data input, an input control signal and an output, said first input of said multiplexer being connected to said data output of said edge-triggered flip-flop, said second input of said multiplexer receiving data from said second output of said combinational circuit, said input control signal of said multiplexer receiving said enable signal generated by said second output of said combinational circuit, and said output of said multiplexer being connected to said data input of said edge-triggered flip-flop.

14. A computer program product for modeling a logic circuit having combinational logic and latches, in which the latches are clocked by one of a first clock phase, a second clock phase or a pulse derived from the second clock phase, the computer program product comprising:
   a computer readable storage medium;
   means recorded on the medium for, for each latch in the logic circuit, associating the latch with one of the first and second clock phase;
   means recorded on said medium for modeling the latch as a buffer connected between the data input and output of the latch when the latch is associated with the first clock phase; and
   means recorded on said medium for modeling the latch as an edge-triggered flip-flop having the same data input, data output and clock input as the latch when the latch is associated with the second clock phase.

15. A program product as defined in claim 14, further including means recorded on the medium for, for each pulse generator clocking a latch and generating said pulse derived from the second clock phase, modeling said pulse generator as a buffer connected between a clock input and clock output of said pulse generator.

16. A program product as defined in claim 14, further including means recorded on said medium for verifying that predetermined modeling conditions are satisfied prior to executing said means for modeling.

17. A program product as defined in claim 14, further including:
   means recorded on the medium for identifying a latch having a clock input which is gated by an enable signal generated by a first output of a combinational circuit, and receiving input data from a second output of said combinational circuit, and which is associated with said second clock phase,
   means recorded on the medium for modeling a latch, identified by said means for identifying, as a combination of an edge-triggered flip-flop and a multiplexer, said edge-triggered flip-flop having the same data output as said latch and having said second clock phase or said pulse derived from said second clock phase connected to its clock input, said multiplexer having a first and second data input, an input control signal and an output, said first input of said multiplexer being connected to said data output of said edge-triggered flip-flop, said second input of said multiplexer receiving data from said second output of said combinational circuit, said input control signal of said multiplexer receiving said enable signal generated by said second output of said combinational circuit, and said output of said multiplexer being connected to said data input of said edge-triggered flip-flop.

18. A program product as defined in claim 14, said means for associating said latch with said first or second clock phase including means recorded on the medium for tracing backward from the clock input of said latch to a clock source.

19. A program product as defined in claim 16, further including means recorded on the medium for identifying scannable latches associated with the second clock phase as a cycle boundary, said means for verifying conditions under which a modeling method is valid including means recorded on the medium for verifying that all scannable latches are on a cycle boundary.

20. A program product as defined in claim 16, said means for verifying conditions under which a modeling method is valid including, means recorded on the medium for verifying that all latches in the fanin of said latch are associated with a different clock phase than its own.

21. A program product as defined in claim 16, said means for verifying conditions under which a modeling method is valid including means recorded on the medium for, for each non-pulse latch associated with said first clock phase, verifying that all latches in the fanout of said non-pulse latch is a non-pulse latch associated with said second clock phase.

22. A program product as defined in claim 16, said means for verifying conditions under which a modeling method is valid including, means recorded on the medium for, for each latch associated with said second clock phase, verifying that all latches in the fanout of said latch are associated with said first clock phase or are pulse latches associated with said second clock phase.

23. A program product as defined in claim 16, said means for verifying conditions under which a modeling method is valid including, means recorded on the medium for, for each pulse latch, verifying that all latches in the fanin of each said pulse latch are associated with said second clock phase.

24. A program product as defined in claim 14, further including, means recorded on the medium for verifying that predetermined modeling conditions are valid including:
   determining whether when said latch is a scannable latch and, if so, verifying that said scannable latch is on a cycle boundary;
   determining whether said latch is a non-pulse latch and, if so, verifying that all latches in its fanin are associated with a different clock phase than its own;
   determining whether said latch is a non-pulse latch associated with said first clock phase and, if so, verifying that all latches in the fanout of said latch is a non-pulse latch associated with said second clock phase;
   determining whether said latch is associated with said second clock phase and, if so, verifying that all latches in the fanout of said latch are associated with the first clock phase or are pulse latches associated with said second clock phase; and
   determining whether said latch is a pulse latch and, if so, verifying that all latches in the fanin of said latch are associated with said second clock phase.

25. A computer program product for modeling a logic circuit having combinational logic and latches, in which the latches are clocked by one of a first clock phase, a second clock phase or a pulse derived from the second clock phase, the computer program product comprising:

a computer readable storage medium;

means recorded on the medium for, for each latch in the logic circuit, associating the latch with one of the first and second clock phase;

means recorded on said medium for modeling a latch as a buffer connected between the data input and output of the latch when the latch is associated with the first clock phase; and means recorded on said medium for modeling the latch as an edge-triggered flip-flop having the same data input, data output and clock input as the latch when the latch is associated with the second clock phase;

means recorded on the medium for identifying a pulse generator clocking a latch and generating said pulse derived from the second clock phase and modeling and identified pulse generator as a buffer connected between a clock input and clock output of said pulse generator;

means recorded on the medium for identifying a latch having a clock input which is gated by an enable signal generated by a first output of a combinational circuit, and receiving input data from a second output of said combinational circuit, and which is associated with said second clock phase, means recorded on the medium for modeling a latch, identified by said means for identifying, as a combination of an edge-triggered flip-flop and a multiplexer, said edge-triggered flip-flop having the same data output as said latch and having said second clock phase or said pulse derived from said second clock phase connected to its clock input, said multiplexer having a first and second data input, an input control signal and an output, said first input of said multiplexer being connected to said data output of said edge-triggered flip-flop, said second input of said multiplexer receiving data from said second output of said combinational circuit, said input control signal of said multiplexer receiving said enable signal generated by said second output of said combinational circuit, and said output of said multiplexer being connected to said data input of said edge-triggered flip-flop; and means recorded on the medium for verifying that predetermined modeling conditions are valid including:

determining whether when said latch is a scannable latch and, if so, verifying that said scannable latch is on a cycle boundary;

determining whether said latch is a non-pulse latch and, if so, verifying that all latches in its fanin are associated with a different clock phase than its own;

determining whether said latch is a non-pulse latch associated with said first clock phase and, if so, verifying that all latches in the fanout of said latch is a non-pulse latch associated with said second clock phase; determining whether said latch is associated with said second clock phase and, if so, verifying that all latches in the fanout of said latch are associated with the first clock phase or are pulse latches associated with said second clock phase; and determining whether said latch is a pulse latch and, if so, verifying that all latches in the fanin of said latch are associated with said second clock phase.

* * * * *